United States Patent [19]

Khurana

[11] Patent Number: 4,680,635
[45] Date of Patent: Jul. 14, 1987

[54] EMISSION MICROSCOPE

[75] Inventor: Neeraj Khurana, Los Gatos, Calif.

[73] Assignee: Intel Corporation, Santa Clara, Calif.

[21] Appl. No.: 846,874

[22] Filed: Apr. 1, 1986

[51] Int. Cl.$^4$ ............................................... H04N 7/18
[52] U.S. Cl. .................................... 358/211; 358/101;
358/106; 358/225
[58] Field of Search .............. 358/211, 225, 101, 106,
358/93

[56] References Cited

U.S. PATENT DOCUMENTS 4,555,731 11/1985 Zinchuk .............................. 358/211
4,570,180 2/1986 Baier .................................... 358/101
4,651,200 3/1987 Lepley ................................ 358/225

OTHER PUBLICATIONS

*NASA Tech. Brief* (Spring 1979) p. 18, "Improving Low-Illumination Video".
1975 *Int. Conf. on the Application of Charge-Coupled Devices,* Currie, "An Intensified CCD for Extremely Low Light Level Operation", pp. 155–163.

*Primary Examiner*—Howard W. Britton
*Attorney, Agent, or Firm*—Blakely, Sokoloff, Taylor & Zafman

[57] ABSTRACT

An emission microscope providing time resolution and high sensitivity to the viewing of light emitted from semiconductor devices is described. The present invention comprises a microscope optic system coupled to an image intensifier. An integrated circuit is viewed with the microscope optics and is stimulated with current flow. As a result of different phenomena, (oxide current, avalanching, and forward biased p-n junctions) light is emitted from the circuit. The image intensifier magnifies the light signal produced by the microscope optics. The output of the intensifier is coupled to a solid-state (CID or CCD) camera. The CID camera outputs a TV signal which is coupled to an image processing computer. The image processing computer controls image enhancement as well as noise reduction. The image processing computer is coupled to an output such as a monitor, a recorder, a printer, or any other suitable display.

24 Claims, 3 Drawing Figures

EMISSION MICROSCOPE

FIELD OF THE INVENTION

This invention relates to the field of emission microscopes.

BACKGROUND ART

In the design of semiconductor devices, it is often desired to analyze current flow through various circuits. Such analysis is particularly beneficial with respect to integrated circuits to isolate points of potential failure. One method of analysis takes advantage of the electroluminescent characteristics of silicon.

Avalanche breakdown can be analyzed by observing emitted light. The light is emitted as a result of the electroluminesence of silicon avalanche. Thus, light emission in this situation enables the detection and location of areas of current flow.

Oxide defects can be detected by observing the light emitted upon application of a current. By observing the emitted light, the points of failure of a damaged product can be determined, and an analysis of design flaws and/or processing flaws can be advantageously undertaken.

Finally, the profile and detailed effects of an ESD (electrostatic discharge) event in an integrated circuit may be determined. During ESD, p-n junctions become forward biased or even go into avalanche breakdown. In either case, light is emitted. By profiling the emitted light pattern, the profile of the ESD event can be observed and the area of dissipation of the ESD energy determined.

In the past, the light emitted from IC devices has been observed through the use of time exposure photography. Typically, a double exposure is made so that the emitted light can be associated with a particular structure or device of the circuit.

A disadvantage with time exposure photography is the inability to isolate time as a factor in the light emission. Typically, time exposure photographs are taken with the device in a steady state condition; however, many failure mechanisms can only be observed in the transient state, such as the hot electron effect in inverters. Inverters typically are subject to hot electron degradation when switching staes. Thus, the timing of the switching transition is important to determine the occurrence of hot electron degradation.

Another past method of observing light emission from IC devices is the use of an infrared or optical microscope. However, these microscopes suffer from an inability to detect faint emission levels. Thus, faint emission of light, or subtle contrasts of emitted light, are often undetectable. Again in these approaches it is not possible to resolve time varying light emission effects.

The amount of light transmitted through a lens is proportional to:

$(N.A)^2/(MAG)$ when NA is the numerical aperature and MAG is the magnification of the lens.

However, there are no commercially available lenses with sufficiently high numerical aperature and low magnification to maximize brightness. Thus, the application of optical microscopes for analysis of the electroluminesence of silicon is limited.

Therefore, it is an object of the present invention to provide an emission microscope which allows stroboscopic observation of extremely faint emitted light from silicon devices in a short period of time.

It is a further object of the present invention to provide an emission microscope which can detect faint emissions of light and small contrasts of emitted light.

SUMMARY OF THE PRESENT INVENTION

An emission microscope providing time resolution and high sensitivity to the viewing of light emitted from semiconductor devices is described. The present invention comprises a microscope optic system coupled to an image intensifier. An integrated circuit is viewed with the microscope optics and is stimulated with current flow. As a result of different phenomena, (oxide current, avalanching, and forward biased p-n junctions) light is emitted from the circuit. The image intensifier magnifies the light signal produced by the microscope optics. The output of the intensifier is coupled to a solid-state (CID or CCD) camera. The CID camera outputs a TV signal which is coupled to an image processing computer. The image processing computer controls image enhancement as well as noise reduction. The image processing computer is coupled to an output means such as a monitor, a recorder, a printer, or any other suitable display means. In the preferred embodiment of the present invention, the image processing computer includes in memory an illuminated image of the semiconductor chip under observation. The image processing computer combines the stored illuminated image with the image of the emitted light in a "double exposure" process so that the location of the emitted light can be accurately determined. The image intensifier may be gated to provide time resolution to the microscope of the present invention. In this manner, time dependent phenomena, such as state changes of inverters or latchup spreading, may be analyzed. To reduce thermal noise introduced by the CID camera and intensifier, they are maintained in a low temperature environment. In order to achieve maximum brightness of the light emitted from the circuit, an objective lens having a high numerical aperature and high magnification is used. A second lens reduces the magnification of the primary lens, maximizing the brightness of the transmitted image.

DETAILED DESCRIPTION OF THE PRESENT INVENTION

An emission microscope which provides time resolution and high sensitivity to the imaging of the electroluminesent output of silicon devices is described. In the following description, numerous specific details are set forth, such as magnification, timing intervals, etc., in order to provide a more thorough understanding of the present invention. It will be obvious, however, to one skilled in the art, that the present invention may be practiced without these specific details. In other instances, well known features have not been described in detail in order not to unnecessarily obscure the present invention.

Figures 1, 2:
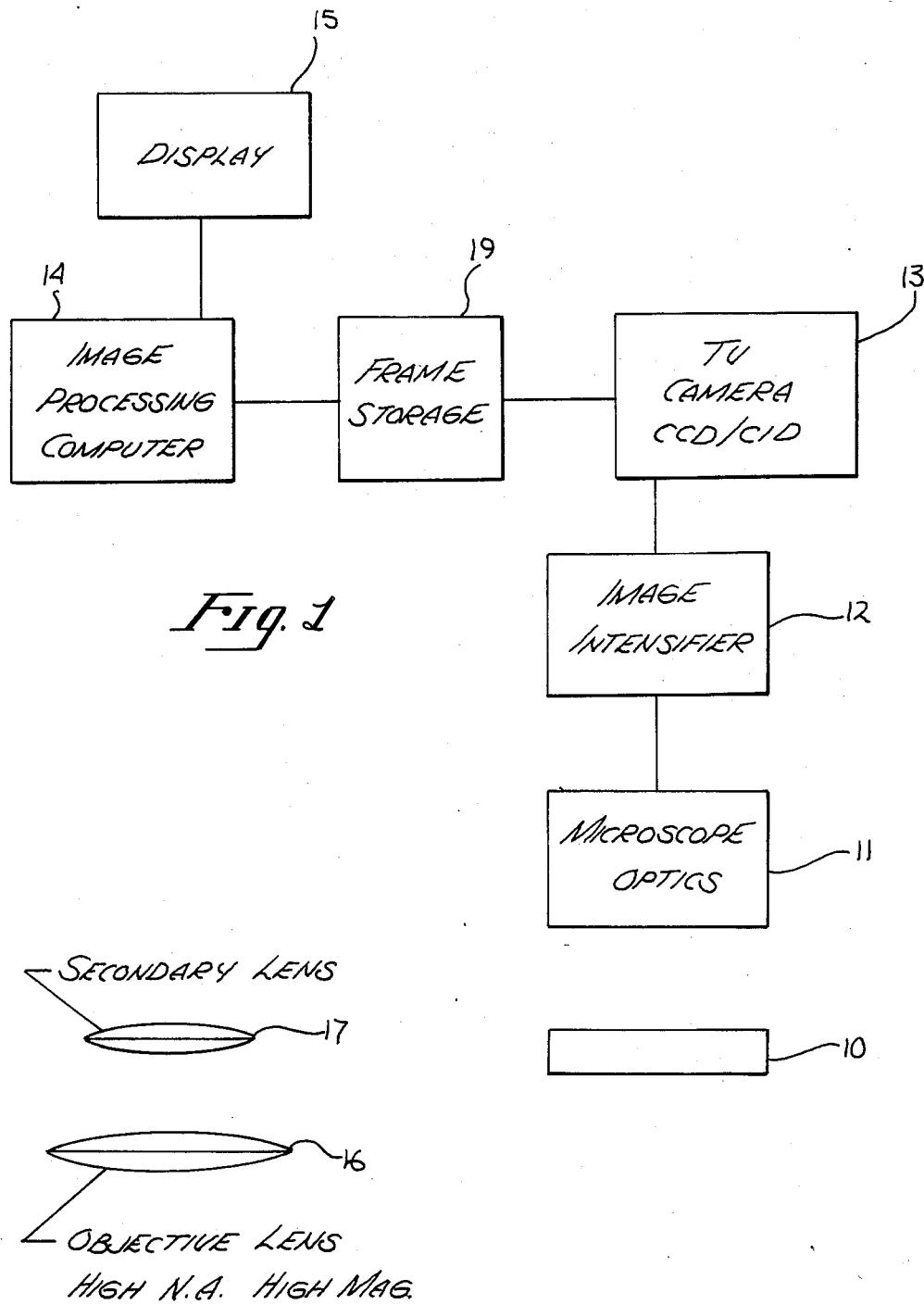
FIG. 1 is a block diagram illustrating the preferred embodiment of the present invention.
FIG. 2 illustrates the optical system of the preferred embodiment of the present invention.

The preferred embodiment of the present invention is illustrated in FIG. 1. The integrated circuit 10 to be observed is disposed beneath the microscope optics 11. The microscope optics are coupled to an image intensifier 18 which amplifies the optical data from the microscope optics 11. The output of the image intensifier 18 is coupled to a camera 13 for converting the optical image into electrical signals. The image signal is then coupled to frame storage 19, and ultimately an image processing computer 14 which enhances the image filters out noise. The image processing computer 14 is in turn coupled to a display 15 which may be a video tape recorder, a cathode ray tube, or a TV monitor.

The microscope optics of the preferred embodiment of the present invention are shown in detail in FIG. 2. The optics of the present invention overcome the problem of sensitivity not met by prior art devices. The output of light as a result of the electroluminesence effect of silicon is very faint, corresponding to "starlight" or less illumination levels. Therefore, it is desired to utilize an optic system which maximizes the brightness of the emitted light so that more efficient detection may result. As previously noted, the brightness of a magnified image is proportional to $NA^2/MAG^2$ where NA is the numerical aperature of a lens and MAG is the overall magnification power of the lens. Thus, to increase the brightness of a magnified image, the numerical aperature must be high or the magnification must be low. In the instant case the size of the integrated circuits to be analyzed constrain the amount of magnification required. In other words, there is a minimum amount of magnification of the circuit required so that individual devices may be identified for more accurate determination of failure modes. In the preferred embodiment of the present invention, a magnification of at least 10% is utilized.

In order to maximize the numerical aperature of the miscroscope optics of the present invention while maintaining the minimum magnification required, the microscope optic system of FIG. 2 is utilized. In the preferred embodiment of the present invention, two lens, 16 and 17, are utilized. The primary lens 16 is an objective lens having a high numerical aperature, (in this case in the range of 0.25-0.8), and a high magnification (approximately 10-100X). In order to maximize the brightness, a secondary lens 17 is utilized to reduce the overall magnification of the image. The secondary lens 17 is a 0.3 to 0.6X lens. The use of multiple lenses results in a reduced field of vision but the size of the lenses are chosen so as to result in a field of vision sufficient for analysis of integrated circuits. Although in the preferred embodiment of the present invention, a magnification of approximately 5X-100X is utilized. The device may be calibrated for different magnification and any acceptable magnification may be utilized.

The output of the microscope optics 11 of the present invention is too faint to be discernable by typical cameras. In order to provide a stronger image, an image intensifier 12 is utilized. In the preferred embodiment of the present invention, the image intensifier comprises a plurality of photomultiplier tubes or micro channels. The image intensifier increase the brightness of the image formed by the microscope optics by a factor of 10,000 to 1 million.

The image intensifier tubes can detect radiation in the visible and near infrared spectrum. The wave length of emitted light of integrated circuit devices is typically in the range of 0.4μ to 1.2 microns. Although the present invention is used for detecting images in the infrared spectrum, the present invention is not utilized to detect temperature variation within the integrated circuit. Rather, the present invention is utilized to detect emitted light from silicon as a result of recombination of electrons and holes.

In order to provide time resolution for the present invention, the image intensifier 12 may be "gated" so that it may act as an electronic shutter. In the preferred embodiment of the present invention, the timing signals for the gating of the image intensifier 12 are provided by a high voltage pulse generator. In the present invention, a time "window" of approximately 20 nanoseconds is achieved.

The image intensifier tube comprises a plurality of micro channels each representing a picture element (pixel) of the final display. For some applications, the brightness level of the emitted light is very faint and a very low number of photoelectrons is emitted. The average number of photoelectrons per pixel may be less than one. An additional problem is created due to the fact that the numer of photoelectrons vary as the square root of the number of photoelectrons. For example, if there were 100 photoelectrons, the square root of 100 is 10, and the number of photoelectrons would vary between 100 plus or minus 10, a variaton of 10%. However, when there are only four photoelectrons, the square root is 2 and the number of photoelectrons varies from 4 to plus or minus 2, a variation of 50%.

Such large variations with low numbers of photoelectrons cause flickering of the image. A further problem is caused by the fact that background noise varies as well. If there were a constant background noise level, it could be subtracted out, and an accurate image produced. However, because the bakcground noise varies, the image must be integrated. The images are integrated so that a large sample, (large number of photoelectrons), is used to produce the image. As previously noted, the larger the number of photoelectrons, the smaller the variation. One method of increasing the sample is to integrate the images over time so that a greater number of photoelectrons are available. This integration over time can be performed in image processing computer. Time integration can also performed in the CID sensor.

A second method of increasing the sample of photoelectrons is to integrate over space. In this method, each pixel is isolated, and the neighbors of the pixel are summed and averaged over these pixels. This method results in loss of image sharpness, and the image gets fuzzy.

In the present invention, the loss of a detailed image is minimized by employing the following method. The recieved image is divided by the computer into two portions, a bright image portion and a faint image portion. The bright image portion is stored in memory and remains untouched. Thus, the detail and sharpness of the bright image portion is maintained. The faint and noisy image portion is integrated over space to reduce the noise. This allows detection of the faint emission levels which were lost in the noise, but without too much detail. The bright and sharp image is now added back to this improved faint image. Thus, the noise is reduced and the sensititivy is improved without loss of sharpness in the bright features of the image. Thus, an improved image is achieved without excessively long integration time or loss of sharpness in the bright regions of the image.

The output of the image intensifier 12 is converted to a TV signal by camera 13. Two types of cameras may be advantageously utilized in the present invention. The first is a charged coupled device (CCD) camera. The CCD camera is utilized when short-term exposures are acceptable.

The second camera is a charge injected device (CIA) camera and is utilized for long-term exposures. The TV image generated by the CID camera is less sharp than the CCD camera, but it can perform time integration of the image. The CCD camera performs a time exposure of 1/60 second only. But the CID camera is capable of time integration of 1/60 second to 1 second. In the preferred embodiment of the present invention, the CID camera is utilized when exposures are greater than 1/60 second are required.

The camera 13 outputs an analog video signal to the frame storage 19. The frame storage includes an analog-to-digital converter to convert the video signal into a digital representation. In the preferred embodiment of the present invention, each of the cameras represent a pixel of the display. The signal from each CCD represents the intensity of the light projected onto that device. In the frame storage this signal is converted into an 8-bit digital representation so that 256 levels of intensity may be defined.

The frame store outputs a digital image signal to the image processing computer 14. The image processing computer 14 receives a series of "frames" representing individual exposures of camera 13. The image processing computer may be a personal computer. The image processing computer is utilized to sum successive frames in a display memory in order to increase the sensitivity of the microscope of the present invention. In the preferred embodiment of the present invention, the display memory of the processing computer includes two to three bytes per pixel. This allows 64,000 images to be summed by the display memory. These integrated images provide greater resolution to the device of the present invention. Additionally, the image processing computer performs background subtraction to further increase the sensitivity of the device. Initially, images of the integrated circuit are taken without electroluminscent effect. Thus, any image received are a result of background noise. The level of this background noise is determined and is filtered out from subsequent images. The background subtraction allows the light emitted from the silicon to be isolated against a dark background. This is called the "emitted radiation pattern" and consists of emitted light against a dark background. In order to identify the source of emitted radiation, the pattern is overlayed on an illuminated image of the integrated circuit so that the specific device and failure mode may be determined.

The output of the image processing computer 14 is put back into the frame store, and then coupled to a display 15. In the preferred embodiment of the present invention, the display 15 comprises a TV monitor. The image processing computer stores individual display screen images for subsequent review. If desired, the display images can be provided with an associated time code so that the time resolution of displayed images may be determined.

The emission microscope of the present invention can be advantageously used to "debug" latchup on complex VLSI CMOS products. It has been discovered that on complex integrated circuits, (SCR) latchup initiates at one location and spreads dramatically to cause latchup in several other locations. Failure occurs at a primary latchup site and then spreads to secondary and tertiary sites. Under normal conditions, the secondary sites latchup approximately 5 microseconds after the primary failure, and the tertiary sites latch up approximately 20 microseconds later. It is important to identify the primary failure site of SCR latchup. The primary failure site is typically visible within 50 to 100 nanoseconds of latchup initiation. By utilizing the gated image intensifier of the present invention, the time resolution feature of the present invention can be advantageously used to identify the primary failure location during latchup within an integrated circuit. A current of 0.5 to 1 milliamp is supplied to the device under consideration. The gated image intensifier is utilized as an electronic shutter to provide pictures at 20 nanosecond intervals. By viewing the images in sequence, the initial latchup site may be identified as well as the secondary latchup sites. Margins at the primary latchup site can then be improved to correct the latchup problem. Improving the margin at secondary locations only has a slight impact on preventing latchup failure. The weakest link in the chain, the primary failure site, must be identified and cured. Prior art systems are unable to identify the primary failure site due to the lack of time resolution. The present invention allows for easy debugging of such problems.

The Emission Microscope can be used to debug 'hot electron problems' on integrated circuits. The 'hot electron problems' are a wearout of the silicon dioxide induced by the avalanche breakdown in silicon. The avalanche is accompanied by an extremely faint light emission. The emission microscope allows the detection of the faint light levels; thereby, defining the locations on the integrated circuit susceptible to hot electron degradation. This allows the integrated circuit designer to define a few changes to reduce such effects. The fast gating capability can narrow down the timing of the avalanche emission to within 10 to 20 nanoseconds. This determination of the timing of hot electron effects, further simplifies the task of defining design changes. The computer image processor can make a quantitative determination of the light emission from each transistor on the integrated circuit. This light measurement makes it possible to determine the hot electron susceptibility of all the thousands of individual transistors on the integrated circuit. Prior art systems do not have the sensitivity to detect the faint light emission without an extremely long and tedious time exposure. Furthermore, the prior art systems cannot determine the timing of the emissions, nor have the light measurement capability.

The photocathode of the image intensifier of the present invention is subject to thermionic emission. Ideally, a photoelectron is generated in the intensifier tube and is multiplied a million fold so that the entire output of the microchannel plate is a direct result of a photoelectron. However, there is a temperature induced emission of electrons in the image intensifier tube which is multiplied and creates "noise" in the output of the tube. As a result, with very faint emission from an integrated circut, noise dominates the output of the image intensifier. Therefore, in an alternate embodiment of the present invention, the image intensifier tube is cooled to approximately zero degrees centigrade. This substantially limits the thermionic emission of electrons so that the output of the image intensifier represents an enhancement of the light emitted from the observed integrated circuit.

In addition to cooling down the image intensifier tube, it may also be desirable to cool down the CID camera. The charged coupled devices comprising the CID camera can be likened to "buckets". Each bucket is empty to begin. With each exposure of the image intensifier, certain buckets begin to fill with electrons, thereby defining images. The electrons come from two sources. First, electrons are emitted from the image intensifier tube and representing the image on the integrated circuit. Secondly, electrons are generated by the camera itself as a result of thermionic emission similar to the image intensifier tube. If the electron "bucket" becomes full, further images are no longer discernable. Therefore, the camera must be "cleared" (the buckets emptied), and the image processing computer must act on the camera image prior to the time when the next image must be cleared.

For a typical CID camera, at room temperature, the camera becomes saturated after approximately ¼ second. Therefore, the image processing computer must integrate excessive images quickly in order to avoid the loss of images. To perform such high-speed integrations, a dedicated expensive image processor such as Gould IP-8500 is required.

Figure 3:
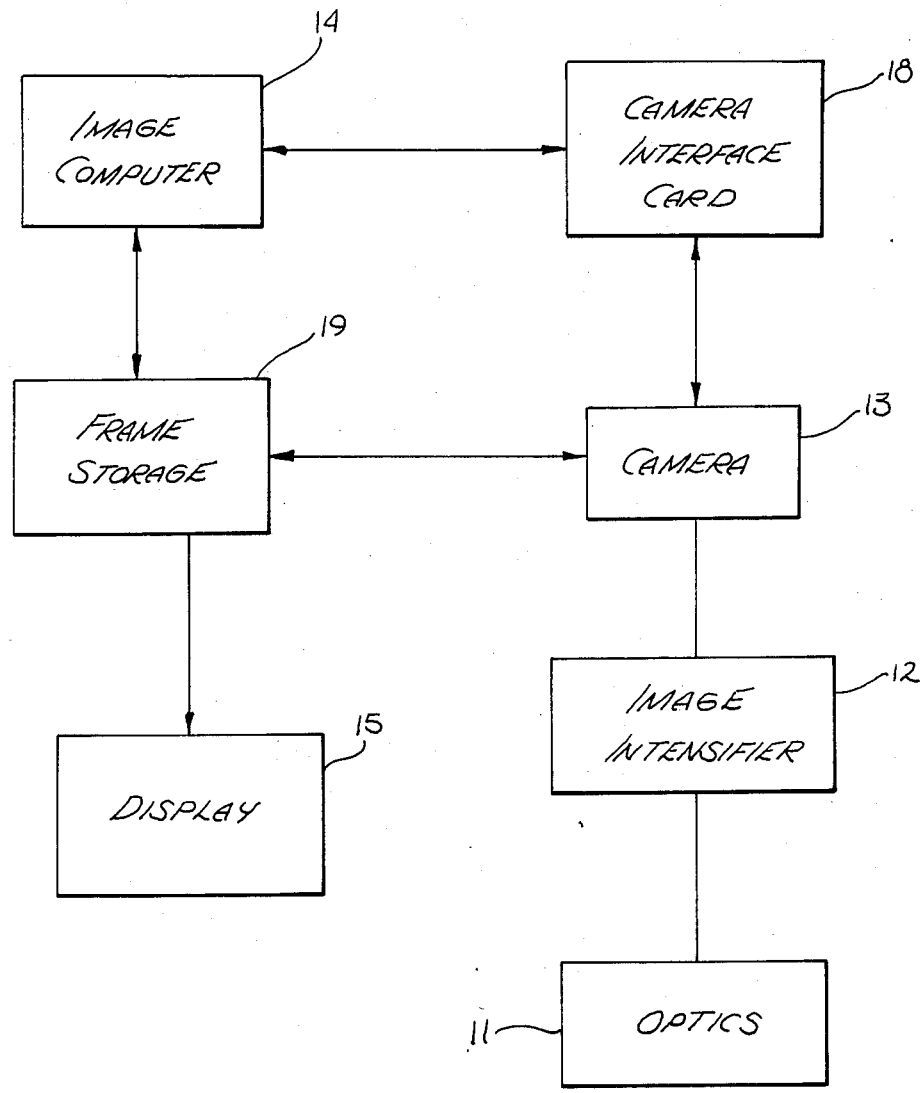
FIG. 3 is a block diagram illustrating an alternate embodiment of the present invention.

However, if a CID camera is cooled to zero degrees centigrade, the thermionic emission of electrons is substantially eliminated, and the camera can be used for approximately 1 second before clearing. Because of the longer exposure time of a cooled CID camera, a dedicated image processor is no longer essential. Thus, a personal computer may be substituted for the image processing computer. Additionally, because of the longer image time and the reduced noise from thermionic emission, the CID camera can act as an analog integrator to integrate a series of images provided from the image intensifier. By cooling the image intensifier and camera, the embodiment of the present invention as shown in FIG. 3 may be employed.

A camera interface card 18 is coupled to the camera 13 and the image computer 14 (which as previously noted) may be a small personal computer. The camera 13 is coupled to a frame storage 19. Frame storage 19 is coupled to the computer 14 and the display 15. The camera interface card 18 serves as a means to alert the image computer 14 that the camera requires clearing. In the preferred embodiment, the camera interface card 18 contains a timer which is set by the computer. The timer counts the time elapsed since the last clearing of the camera. As it approaches the time limit indicating that the camera 13 should be cleared, it alerts the image computer 14 and also issues the clearing command to the camera. This time limit for clearing is typically half a second for the camera operating at room temperature, and can be increased to one second for the camera cooled to zero centigrade. If at this clearing time, the image computer 14 has finished integrating the previous images, it issues a command to the frame storage to capture and store the time exposure sent by the camera. The frame storage creates a digital representation of the image and stores it in its memory. The computer then accesses this digital representation and adds it to the previous sum of images. If the image computer 14 is busy adding the image at the time of the camera clearing, the time exposure sent out by the camera 13 is ignored by the frame storage 19. The personal computer can add the digital representation of the image in 0.6 to 0.9 seconds. If this time is less than the clearing time of the CID camera 13, all the time exposures generated by the camera will be integrated. A slight cooling of the CID camera allows a clearing time of 1 second, thereby allowing all the light emitted to be integrated. Thus, this scheme of cooled CID camera and the camera control card allows the substitution of a small computer for a large, fast, and expensive computer.

Thus, an emission microscope providing time resolution and improved imaging capabilities is achieved.

I claim:

1. A microscope comprising:
   optical means comprising first and second lenses, said second lens for reducing the magnification of said first lens, said optical system outputting an optical image;
   intensifier means coupled to said optical means, said intensifier means for intensifying said optical image and outputting an intensified image;
   camera means coupled to said intensifier means for converting said intensified image to an electronic image signal;
   processing means coupled to said camera means for removing noise from said electronic image signal and enhancing said electronic image signal;
   display means coupled to said processing means for displaying a display image generated from said electronic image signal.

2. The microscope of claim 1 wherein said intensifier means comprises a photomultiplier for outputting a plurality of output electrons for each input electron.

3. The microscope of claim 2 wherein said photomultiplier comprises a plurality of microchannels.

4. The microscope of claim 1 wherein said intensifier means is gated such that said intensifier means is enabled for fixed periods of time.

5. The microscope of claim 1 wherein said camera means comprises a plurality of charge coupled devices disposed in an array.

6. The microscope of claim 1 wherein said camera means comprises a plurality of charge injected devices disposed in an array.

7. The microscope of claim 1 wherein said processing means comprises an image processing computer.

8. The microscope of claim 7 wherein said processing means integrates a plurality of electronic image signals to create a composite image.

9. The microscope of claim 8 wherein said processing means combines said image signals with a background image wherein landmarks of said electronic image signals may be identified.

10. The microscope of claim 1 wherein said display means comprises a television monitor.

11. The microscope of claim 1 wherein said intensifier means and said camera means are maintained at low temperatures so as to reduce thermionic emission of electrons.

12. The microscope of claim 1 wherein said microscope is used to detect infrared radiation produced by electroluminescent effects of silicon.

13. A device for magnifying and displaying output images of light emitted from semiconductor devices as a result of electrical stimulation, said device comprising:
   optical means for viewing said semiconductor device, said optical means comprising a first objective lens for identifying said emitted light and a second lens for reducing the magnification of said first lens, said optical means outputting an optical image;

intensifier means coupled to said optical means for intensifying said optical image and outputting an intensified image;

camera means coupled to said intensifier means for converting said intensified image to a video image signal;

processing means coupled to said camera means for removing noise from said video image signal and enhancing said video image signal, said processing means outputting an enhanced image signal;

display means coupled to said processing means for displaying said output image generated from said enhanced image signal.

14. The device of claim 13 wherein said intensifying means comprises a plurality of microchannels, each of said microchannels outputting a plurality of electrons for each input electron.

15. The device of claim 13 wherein said intensifier means includes gating means for enabling said intensifier means for fixed periods of time.

16. The device of claim 13 wherein said camera comprises a plurality of charge coupled device disposed in an array.

17. The device of claim 13 wherein said camera means comprises a plurality of charge injected devices disposed in an array.

18. The device of claim 13 wherein said processing means integrates a plurality of said video image signals to create a composite video signal.

19. The device of claim 13 wherein said processing means combines said video image signal with a background image of said semiconductor device.

20. The device of claim 13 wherein said intensifier means and said camera means are maintained at low temperatues to reduce thermionic emission of electrons.

21. The device of claim 13 further including control means coupled to said processing means and said camera means, said control means for outputting a first signal to said processing means when said camera means reaches a saturation point.

22. The device of claim 21 further including frame storage means coupled to said processing means and said display means, said frame storage means for storing said video image signal and converting said video image signal to a digital signal.

23. A method for displaying light emitted from integrated circuits as a result of the electroluminesent effects of silicon, said method comprising the steps of:

passing said emitted light through an optical system, said optical system comprising first and second lenses, said second lens for reducing the magnification of said first lens;

passing the output of said optical system through an image intensifier, said image intensifier comprising a plurality of photomultiplier microchannels, said microchannels outputting plurality of electrons for each input electron;

converting said output of said image intensifier to a video image signal through use of a camera comprising a plurality of charge sensitive devices;

coupling said video image signal to a processing means, said processing means integrating a plurality of said video image signals, subtracting out background noise, and superimposing said integrated video image signals on a background image of said integrated circuit to produce a composite image;

displaying said composite image on a TV monitor coupled to said processing means.

24. The method of claim 23 further including the step of enabling said intensifier means for fixed periods of time to provide time resolution of said displayed images.

* * * * *